(12) United States Patent
Hammond (10) Patent No.: US 8,354,901 B1
(45) Date of Patent: Jan. 15, 2013

(54) THERMALLY TOLERANT ANCHOR CONFIGURATION FOR A CIRCULAR CANTILEVER

(75) Inventor: Jonathan Hale Hammond, Oak Ridge, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 136 days.

(21) Appl. No.: 12/709,979

(22) Filed: Feb. 22, 2010

Related U.S. Application Data (60) Provisional application No. 61/154,238, filed on Feb. 20, 2009, provisional application No. 61/156,965, filed on Mar. 3, 2009.

(51) Int. Cl.
*H01H 51/22* (2006.01)
(52) U.S. Cl. ......................................... 335/78; 200/181
(58) Field of Classification Search ............... 335/78; 200/181
See application file for complete search history.

(56) References Cited

U.S. PATENT DOCUMENTS

| | | | |
|---|---|---|---|
| 6,625,004 B1 * | 9/2003 | Musolf et al. | 361/278 |
| 6,639,494 B1 * | 10/2003 | Bluzer | 335/78 |
| 6,777,765 B2 * | 8/2004 | Chen et al. | 257/415 |
| 7,135,766 B1 | 11/2006 | Costa et al. | |
| 7,956,709 B2 * | 6/2011 | Watanabe et al. | 335/78 |
| 7,999,643 B1 * | 8/2011 | Dening et al. | 335/78 |
| 8,018,308 B2 * | 9/2011 | Kwon et al. | 335/78 |
| 2006/0012014 A1 | 1/2006 | Chen et al. | |
| 2006/0108675 A1 | 5/2006 | Colgan et al. | |
| 2006/0181379 A1 * | 8/2006 | Schwartz et al. | 335/78 |
| 2006/0254345 A1 | 11/2006 | King et al. | |
| 2007/0103028 A1 | 5/2007 | Lewis et al. | |
| 2007/0172975 A1 | 7/2007 | Tomomatsu et al. | |
| 2007/0202626 A1 | 8/2007 | Liu | |
| 2007/0281381 A1 | 12/2007 | Ayazi | |
| 2008/0164542 A1 | 7/2008 | Yang et al. | |

OTHER PUBLICATIONS

Reines, I. et al., "Performance of Temperature-Stable RF MEMS Switched Capacitors under High RF Power Conditions," 2010 IEEE MTT-S International Microwave Symposium Digest (MTT), May 23-28, 2010, pp. 292-295, IEEE.

Costa, J. et al., "Integrated MEMS Switch Technology on SOI-CMOS," Proceedings of Hilton Head Workshop 2008: A Solid-State Sensors, Actuators and Microsystems Workshop, Jun. 2008, 4 pages.

Costa, J. et al., "A Silicon RFCMOS SOI Technology for Integrated Cellular/WLAN RF TX Modules," Proceedings of the IEEE MTS Microwave Symposium, Jun. 2007, pp. 445-448, IEEE.

(Continued)

*Primary Examiner* — Bernard Rojas
(74) *Attorney, Agent, or Firm* — Withrow & Terranova, P.L.L.C.

(57) ABSTRACT

A micro-electromechanical systems (MEMS) includes a substrate onto which a first conductive pad and a second conductive pad are formed. A conductive anchor coupled to the first conductive pad is a semi-circular frame that includes a first radial tab and a second radial tab. A conductive cantilever disc has a first end portion, a middle portion, and a second end portion. The first end portion of the conductive cantilever disc is coupled to the first radial tab and the second radial tab of the conductive anchor. The second end portion of the conductive cantilever disc is suspended over the second conductive pad with the middle portion being between the first end portion and the second end portion. A conductive actuator plate is formed onto the substrate at a location beneath the middle portion of the cantilever disc and between the first conductive pad and the second conductive pad.

13 Claims, 8 Drawing Sheets

OTHER PUBLICATIONS

Guan, Lingpeng et al., "A Fully Integrated SOI RF MEMS Technology for System-on-a-Chip Applications," IEEE Transactions on Electron Devices, Jan. 2006, pp. 167-172, vol. 53, No. 1, IEEE.

Joseph, Alvin et al., "A 0.35 um SiGe BiCMOS Technology for Power Amplifier Applications," IEEE BCTM Conference Proceedings, Sep. 30-Oct. 2, 2007, pp. 198-201, IEEE.

Kelly, Dylan et al., "The State-of-the-Art of Silicon-on-Sapphire CMOS RF Switches," Proceedings of the IEEE Compound Semiconductor Symposium, Oct. 30-Nov. 2, 2005, pp. 200-205.

Mazure, Carlos et al., "Engineering Wafers for the Nanotechnology Era," Proceedings of ESSCIRC, Sep. 2005, pp. 29-38, IEEE.

Shokrani, Mohsen et al., "InGap-Plus(TM): A Low Cost Manufacturable GaAs BiFET Process Technology," Proceedings of the GaAs MANTECH Conference, Nov. 2006, pp. 153-156.

Tinella, C. et al, "0.13um CMOS SOI SP6T Antenna Switch for Multi-Standard Handsets," Topic Meeting on Silicon Monolithic Circuits in RF Systems, Jan. 2006, pp. 58-61, IEEE.

Tombak, Ali et al, "A Flip-Chip Silicon IPMOS Power Amplifier and a DC/DC Converter for GSM 850/900/1800/1900 MHz Systems," Proceedings of the IEEE Radio Frequency Integrated Circuits Symposium, Jun. 2007, pp. 79-82, IEEE.

Wohlmuth, Walter A. et al., "E-/D-pHEMT Technology for Wireless Components," Proceedings of the Compound Semiconductor Circuit Symposium, Oct. 2004, pp. 115-118, IEEE.

De Silva, A.P. et al, "Motorola MEMS switch technology for high frequency applications," 2001 Microelectromechanical Systems Conference, Aug. 2001, pp. 22-24, IEEE.

Notice of Allowance for U.S. Appl. No. 11/955,918 mailed Apr. 2, 2010, 9 pages.

Final Office Action for U.S. Appl. No. 11/955,918 mailed Jan. 8, 2010, 11 pages.

Non-final Office Action for U.S. Appl. No. 11/955,918 mailed Jun. 25, 2009, 14 pages.

Notice of Allowance for U.S. Appl. No. 12/710,108 mailed Jan. 9, 2012, 7 pages.

Non-final Office Action for U.S. Appl. No. 12/710,108 mailed Sep. 1, 2011, 6 pages.

Notice of Allowance for U.S. Appl. No. 12/710,108 mailed Jul. 13, 2010, 8 pages.

* cited by examiner

THERMALLY TOLERANT ANCHOR CONFIGURATION FOR A CIRCULAR CANTILEVER

RELATED APPLICATIONS

This application claims the benefit of provisional patent application Ser. No. 61/154,238, filed Feb. 20, 2009, and provisional patent application Ser. No. 61/156,965, filed Mar. 3, 2009, the disclosures of which are hereby incorporated herein by reference in their entireties. This application also relates to U.S. patent application Ser. No. 12/710,195 entitled "Thermally Neutral Anchor Configuration for an Electromechanical Actuator" and also to U.S. patent application Ser. No. 12/710,108, now U.S. Pat. No. 8,314,467, entitled "Thermally Tolerant Electromechanical Actuators", both of which were concurrently filed on Feb. 22, 2010, the disclosures of which are hereby incorporated herein by reference in their entireties. This application further relates to U.S. patent application Ser. No. 11/955,918 entitled "Integrated MEMS Switch", filed on Dec. 13, 2007, now U.S. Pat. No. 7,745,892, the disclosure of which is hereby incorporated by reference in its entirety.

FIELD OF THE DISCLOSURE

The present disclosure relates to RF MEMS switches, and in particular the stable volume manufacture of RF MEMS switches.

BACKGROUND

As electronics evolve, there is an increased need for miniature switches that are provided on semiconductor substrates along with other semiconductor components to form various types of circuits. These miniature switches often act as relays, and are generally referred to as micro-electromechanical system (MEMS) switches. MEMS switches generally include a moveable portion such as a cantilever, which has a first end anchored to the semiconductor substrate, and a second free end having a cantilever contact. When the MEMS switch is activated, the cantilever moves the cantilever contact against a substrate contact on the semiconductor substrate and under the cantilever contact.

Figure 1A:
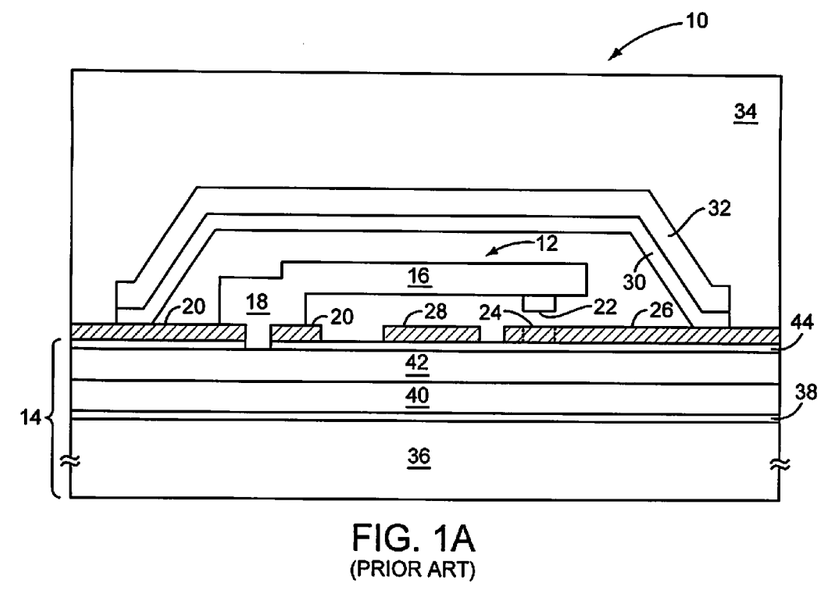
FIGS. 1A and 1B illustrate an exemplary micro-electromechanical systems (MEMS) switch in an open and closed position respectively.
Figure 1B:
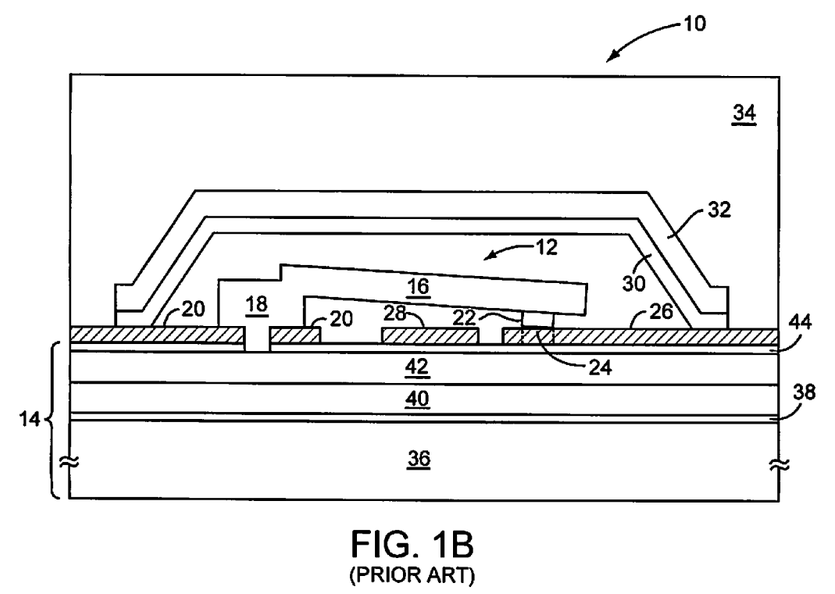

Turning to FIGS. 1A and 1B, a semiconductor device 10 having a MEMS switch 12 is illustrated. The MEMS switch 12 is effectively formed on a semiconductor substrate 14. The MEMS switch 12 includes a cantilever 16, which is formed from a conductive material, such as gold. The cantilever 16 has a first end and a second end. The first end is coupled to the semiconductor substrate 14 by an anchor 18. The first end of the cantilever 16 is also electrically coupled to a first conductive pad 20 at or near the point where the cantilever 16 is anchored to the semiconductor substrate 14. Notably, the first conductive pad 20 may play a role in anchoring the first end of the cantilever 16 to the semiconductor substrate 14 as depicted.

The second end of the cantilever 16 forms or is provided with a cantilever contact 22, which is suspended over a contact portion 24 of a second conductive pad 26. Thus, when the MEMS switch 12 is actuated, the cantilever 16 moves the cantilever contact 22 into electrical contact with the contact portion 24 of the second conductive pad 26 to electrically connect the first conductive pad 20 to the second conductive pad 26.

To actuate the MEMS switch 12, and in particular to cause the second end of the cantilever 16 to move the cantilever contact 22 into contact with the contact portion 24 of the second conductive pad 26, an actuator plate 28 is disposed over a portion of the semiconductor substrate 14 and under the middle portion of the cantilever 16. To actuate the MEMS switch 12, a potential difference is applied between the cantilever 16 and the actuator plate 28. The presence of this potential difference creates an electrostatic force that effectively moves the second end of the cantilever 16 toward the actuator plate 28, thus changing the position of the cantilever 16 from the position illustrated in FIG. 1A to the position illustrated in FIG. 1B.

Typically, the first conductive pad 20, the second conductive pad 26, and the actuator plate 28 are formed from a single metallic or conductive layer, such as gold, copper, platinum, or the like. The particular form factor for the first conductive pad 20, second conductive pad 26, and actuator plate 28 is provided through an etching or other patterning technique. With continued reference to FIGS. 1A and 1B, the MEMS switch 12 may be encapsulated by one or more encapsulating layers 30 and 32, which make up a wafer level package (WLP) around the MEMS switch 12. Moreover, the encapsulating layers 30 and 32 form a substantially hermetically sealed cavity about the cantilever 16. The cavity is generally filled with an inert gas. Once the encapsulation layers 30 and 32 are in place and any other semiconductor components are formed on the semiconductor substrate 14, a plastic overmold 34 may be provided over the encapsulation layers 30 and 32 and any other semiconductor components.

With continued reference to FIGS. 1A and 1B, the substrate 14 is preferably formed using a semiconductor-on-insulator process, such as a silicon- or sapphire-on-insulator process. In particular, the substrate 14 includes a handle wafer 36 that is formed from silicon, sapphire, glass, or like material to form a foundation layer for the semiconductor device 10. The handle wafer 36 is typically a few hundred microns thick. An insulator layer 38 is formed over the handle wafer 36. The insulator layer 38 is generally formed from an oxide, such as Silicon Dioxide ($SiO_2$), which may range in thickness from 0.1 to 2 microns in the preferred embodiment. A device layer 40, which may include one or more layers, is formed using an appropriate semiconductor material.

The device layer 40 is the layer or layers in which active semiconductor devices, such as transistors and diodes that employ PN junctions, are formed. The device layer 40 is initially formed as a base semiconductor layer that is subsequently doped with N-type and P-type materials to form the active semiconductor devices. Thus, the active semiconductor devices, except for any necessary contacts or connections traces, are generally contained within the device layer 40. Those skilled in the art will recognize various techniques for forming active semiconductor devices in the device layer 40. A metal-dielectric stack 42 is formed over the device layer 40, wherein a plurality of metal and dielectric layers are alternated to facilitate connection with and between the active devices formed in the device layer 40. Further, in the preferred embodiment the handle wafer 36 is made of a high-resistivity semiconductor material where resistance is greater than 50 ohm-cm.

With the present disclosure, active semiconductor devices may be formed in the device layer 40 and connected to one another via the metal-dielectric stack 42 directly underneath the MEMS switch 12. Since the device layer 40 resides over the insulator layer 38, high voltage devices, which may exceed ten (10) volts in operation, may be formed directly under the MEMS switch 12 and connected in a way to control operation of the MEMS switch 12 or associated circuitry. Although silicon is described in the preferred embodiment, the semiconductor material for the device layer 40 may include gallium arsenide (GaAs), gallium nitride (GaN), indium phosphide (InP), silicon germanium (SiGe), sapphire, and like semiconductor materials. The device layer 40 typically ranges in thickness from 0.1 microns to 20 or more microns.

Figure 2:
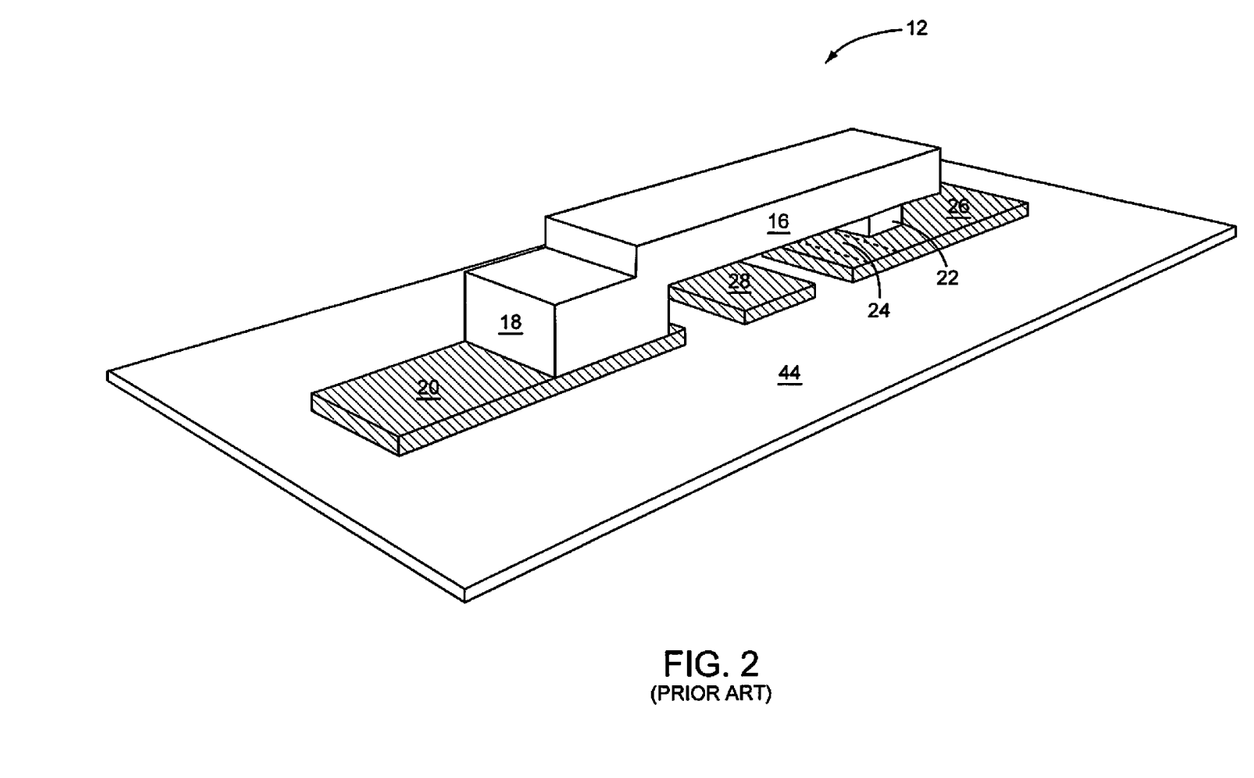
FIG. 2 is a perspective view of a portion of the MEMS switch of FIGS. 1A and 1B.

As illustrated in FIGS. 1A and 1B, a passivation layer 44 may be provided over the metal-dielectric stack 42. As may be best seen from the perspective view of FIG. 2, a metal layer used to form the first conductive pad 20, the second conductive pad 26, and the actuator plate 28 may be formed over the passivation layer 44 and etched to form the respective ones of the first conductive pad 20, the second conductive pad 26, and the actuator plate 28. Prior to packaging, the cantilever 16 is 'released' and is free to actuate or deform. In particular, the cantilever 16 may be released following formation of a small micro-cavity surrounding the MEMS switch 12. A sacrificial material such as polymethylglutarimide (PMGI) is etched away using wet etches. Following drying and cleaning of the MEMS switch 12, a dielectric is used to hermetically seal the micro-cavity. The deposition temperature for the dielectric is typically 250° C. Later in the manufacturing process, the device can experience multiple exposures to 260° C. solder reflow during attachment of a module incorporating the MEMS switch 12 to an end-user laminate.

Figure 3:
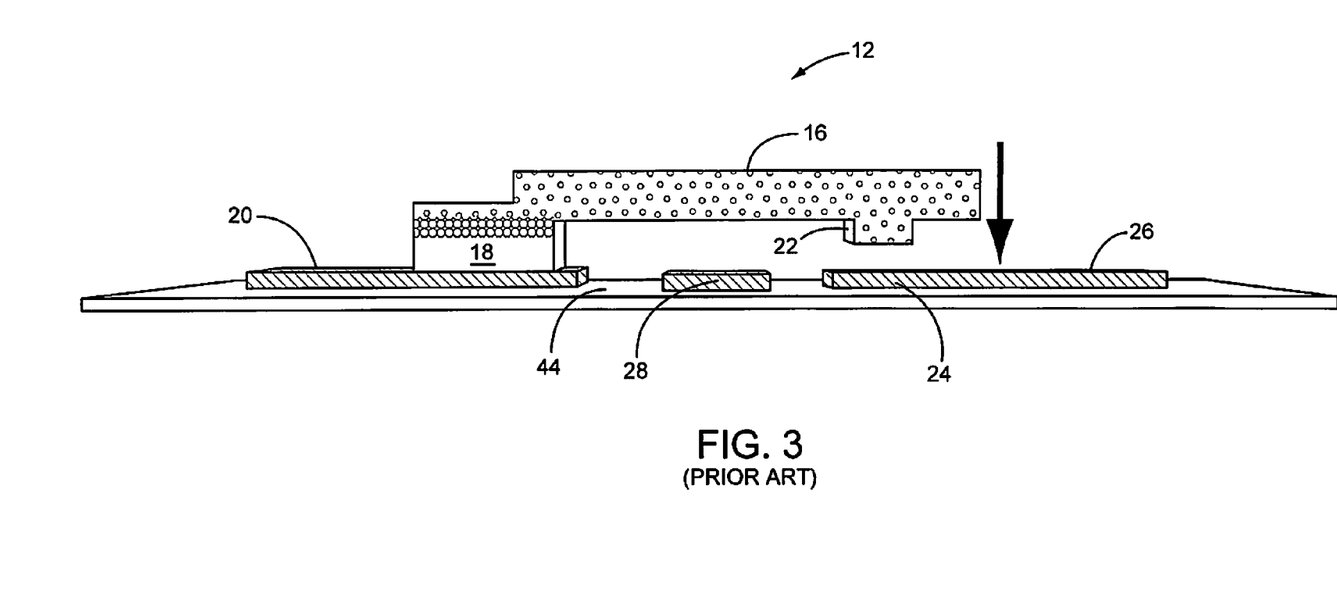
FIG. 3 illustrates the thermally induced mechanical stress in the MEMS switch during manufacturing.

A problem of undesirable deformation of the MEMS switch 12 often occurs due to a significant difference in the coefficient of thermal expansion (CTE) between the metal comprising MEMS switch 12 and the semiconductor or insulator comprising passivation layer 44. The CTE of the metal making up the MEMS switch 12 often ranges from two to seven times larger than the CTE of the semiconductor or insulator making up the passivation layer 44. At room temperature (i.e., 25° C.), the difference in the CTE does not present a problem. However, during manufacture, assembly, or operation of the MEMS switch 12, the temperature of the MEMS switch 12 and the substrate 14 (FIGS. 1A and 1B) including the passivation layer 44 can range from 85° C. to 400° C. In such circumstances, particularly in the case of an ohmic contact switch function for MEMS switch 12, it is desirable to ensure that the cantilever contact 22 and second conductive pad 26 or passivation layer 44 do not make contact. FIG. 3 illustrates how differences in CTE may lead to a thermally induced deformation of the cantilever 16. A plurality of dots shown in a side cross-section of the cantilever 16 and the anchor 18 represent individual metal domains making up the cantilever 16 and the anchor 18. As the MEMS switch 12 is heated during manufacturing and/or assembly, the metal domains expand and push against each other. The domains further from the passivation layer 44 are allowed to expand more than domains closer to the passivation layer 44, thereby producing a deflection force on the cantilever 16. The deflection force is represented by an arrow at the free end of the cantilever 16. In this case, the deflection force urges the cantilever towards the passivation layer 44.

Figure 4:
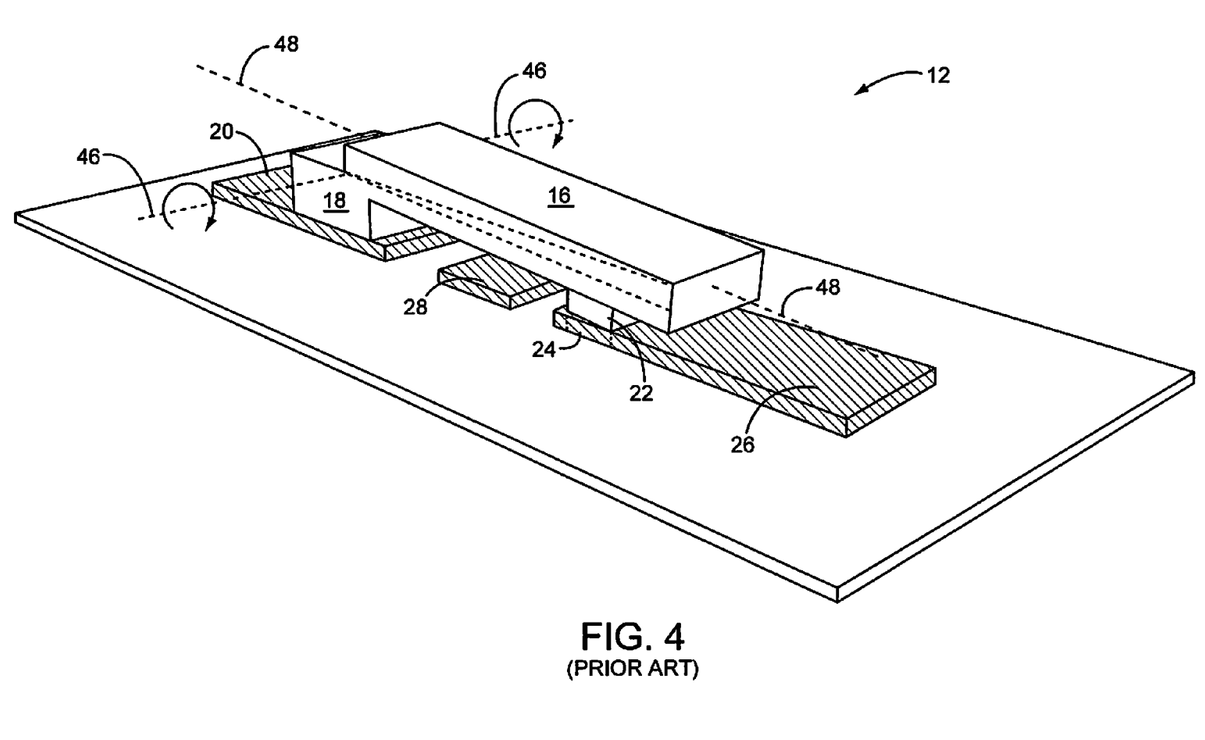
FIG. 4 depicts the failure of the MEMS switch as a result of the thermally induced mechanical stress illustrated in FIG. 3.

FIG. 4 depicts the results of a finite element simulation of the mechanical effects experienced by the MEMS switch 12 when the MEMS switch 12 is heated to a steady state temperature of 300° C. The finite element simulation shows when the MEMS switch 12 reaches a temperature of 300° C., the cantilever 16 will have rotated enough that the cantilever contact 22 will be in contact with the second conductive pad 26. MEMS switch 12 has a switch open state that typically maintains a one-half micrometer gap between the cantilever contact 22 and the second conductive pad 26. Further finite element simulations show that the deflection of the cantilever 16 may allow the cantilever contact 22 to traverse gap distances that exceed one-half micrometer.

Notice that a rotational axis 46 of the cantilever 16 is perpendicular to a longitudinal axis 48 of the cantilever 16. As suggested by the finite element simulations, due to the combination of the significant difference in CTE between the metal of MEMS switch 12 and the semiconductor or insulator comprising passivation layer 44 and the elevated temperatures experienced by the MEMS switch 12 during manufacturing, assembly, or operation, the cantilever 16 may be thermally deflected to rotate about the rotational axis 46. As the temperature of the MEMS switch 12 increases, the rotation of cantilever 16 may become so pronounced that the cantilever contact 22 will contact the second conductive pad 26. An adhesion between the cantilever contact 22 and the second conductive pad 26 may prevent the cantilever contact 22 and the second conductive pad 26 from breaking contact as the temperature of the MEMS switch 12 decreases. A failure to break contact between the cantilever contact 22 and the second conductive pad 26 will result in a failed MEMS switch along with a failed product incorporating the MEMS switch 12.

Figure 5:
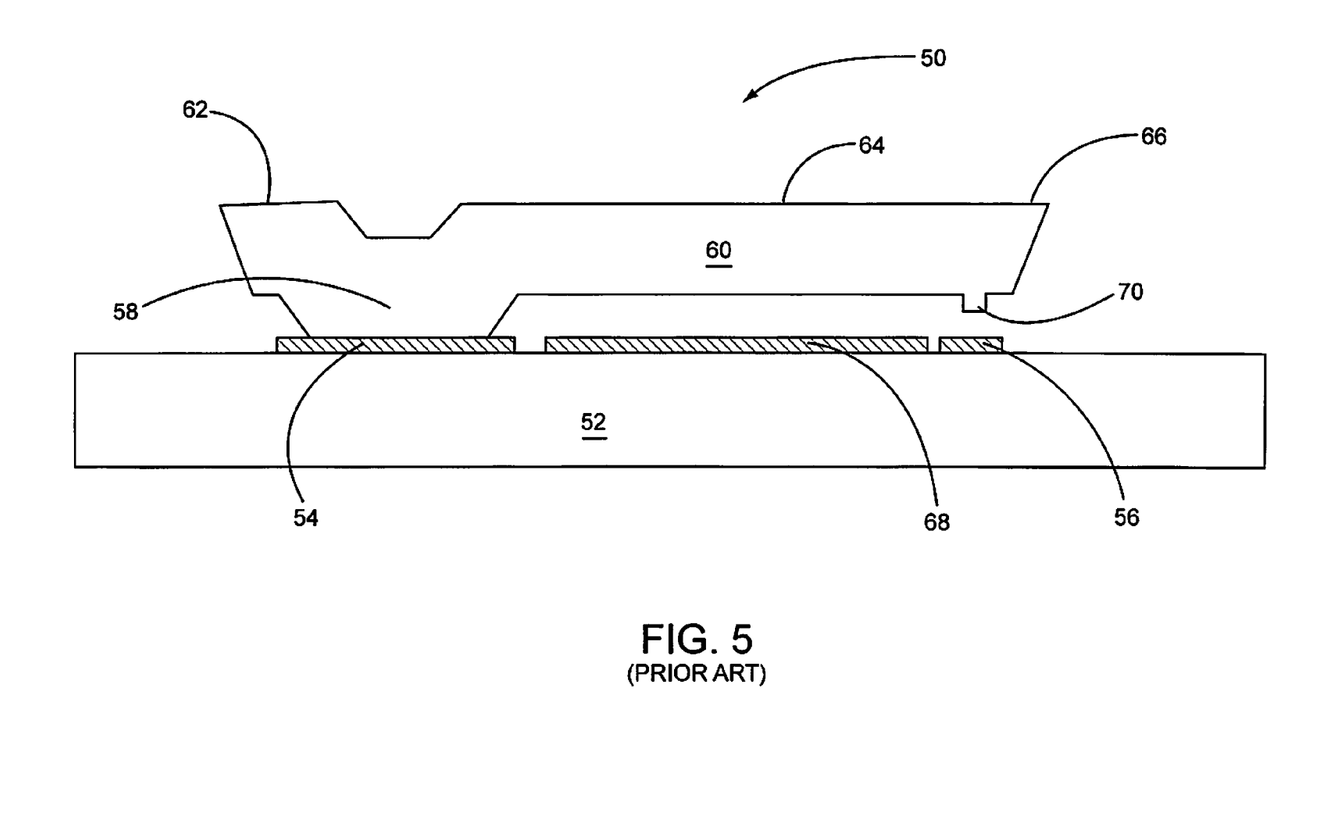
FIG. 5 depicts a Defense Advanced Research Projects Agency (DARPA) proposed MEMS switch.

FIG. 5 depicts a MEMS switch 50 that has been proposed by the Defense Advanced Research Projects (DARPA). The DARPA MEMS switch 50 includes a substrate 52 onto which a first conductive pad 54 and a second conductive pad 56 are formed. A conductive anchor 58 is coupled to the first conductive pad 54 A conductive cantilever disc 60 has a first end portion 62, a middle portion 64, and a second end portion 66. The second end portion 66 of the conductive cantilever 60 is suspended over the second conductive pad 56 with the middle portion 64 being between the first end portion 62 and the second end portion 66. A conductive actuator plate 68 is formed onto the substrate 52 at a location beneath the middle portion 64 of the conductive cantilever disc 60 and between the first conductive pad 54 and the second conductive pad 56. When a potential difference is applied to the actuator plate 68, an electrostatic force pulls the cantilever disc 60 towards the substrate 52 until an electrical contact 70 comes into contact with the second conductive pad 56.

Unfortunately, it has been found that the DARPA proposed MEMS switch 50 suffers from yield losses comparable to those experienced by MEMS switch 12 (FIGS. 1A, 1B, 2, 3 and 4) when subjected to the elevated temperatures experienced by the MEMS switch 50 during manufacturing, and assembly. To demonstrate the thermal actuation occurs, the DARPA proposed MEMS switch 50 shown in FIG. 6 was modeled with a thermal finite element analysis. A cantilever disc 72 attached to conductive anchors 74 and 76 was simulated under a manufacturing thermal environment of 300° C. An attachment axis 78 for anchor 74 and an attachment axis 80 for anchor 76 are tangential to a circumference around the cantilever disc 72. Therefore, a deflection of the cantilever disc 72 is expected as the cantilever disc 72 expands due to a high thermal environment of 300° C. during manufacturing. In fact, a simulation result predicts that a tip 82 of the cantilever disc 72 would deflect towards a substrate 84 by at least 0.3 micrometers (µm). Such a large tip deflection could potentially result in manufacturing yield loss or shifts in critical device parameters, as well as product failure of any product relying on MEMS switch such as the DARPA proposed MEMS switch 50 (FIG. 5).

Significant yield loss, which may approach upwards 50%, may be attributed to this thermally induced actuation during manufacture of devices with the kinds of attachment configurations described above. Thus, the need for a structure which can prevent this kind of thermal actuation is apparent.

SUMMARY OF THE DISCLOSURE

An embodiment of the present disclosure relates to the physical and geometric configuration of an anchor attachment between the movable part of an electromechanical actuator and its underlying substrate. In general, the present disclosure provides an adaptation of a Defense Advanced Research Projects Agency (DARPA) proposed cantilever disc design for a micro-electromechanical systems (MEMS) switch.

In particular, an embodiment of the present disclosure is a MEMS switch having a thermally neutral anchor configuration. The disclosed MEMS switch includes a substrate onto which a first conductive pad and a second conductive pad are formed. A conductive anchor coupled to the first conductive pad is a semi-circular frame that includes a first radial tab and a second radial tab. A conductive cantilever disc has a first end portion, a middle portion, and a second end portion. The first end portion of the conductive cantilever disc is coupled to the first radial tab and the second radial tab of the conductive anchor. The first end portion of the conductive cantilever disc includes a pair of strain relief slots defined by inner surfaces. The second end portion of the conductive cantilever disc is suspended over the second conductive pad with the middle portion being between the first end portion and the second end portion. A conductive actuator plate is formed onto the substrate at a location beneath the middle portion of the cantilever disc and between the first conductive pad and the second conductive pad. When an activation voltage is applied to the actuator plate, an electrostatic force urges the cantilever beam towards the substrate until a pair of electrical contacts comes into contact with the second conductive pad.

Those skilled in the art will appreciate the scope of the present disclosure and realize additional aspects thereof after reading the following detailed description in association with the accompanying drawings.

BRIEF DESCRIPTION OF THE DRAWING FIGURES

The accompanying drawing figures incorporated in and forming a part of this specification illustrates several aspects of the invention and together with the description serve to explain the principles of the invention.

DETAILED DESCRIPTION

The attachment configuration for the anchor and the cantilever disc proposed by DARPA has axes of attachment that are tangential to the cantilever disc. In an embodiment of the present disclosure, the attachment axes are perpendicular to tangents of the cantilever disc. As a result, thermally induced deflections of the cantilever beam are neutralized such that a tip of the cantilever disc deflects away from a substrate over which the cantilever disc is suspended.

Figure 6:
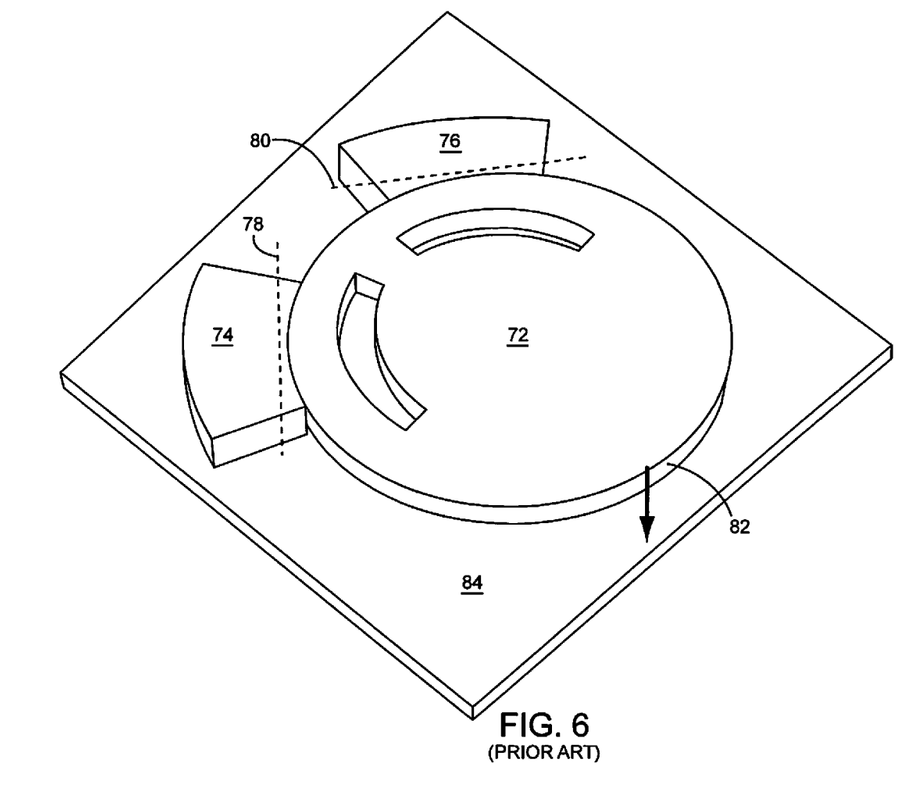
FIG. 6 depicts an adaptation of the DARPA proposed MEMS switch that is useable for thermal finite element analysis.
Figure 7:
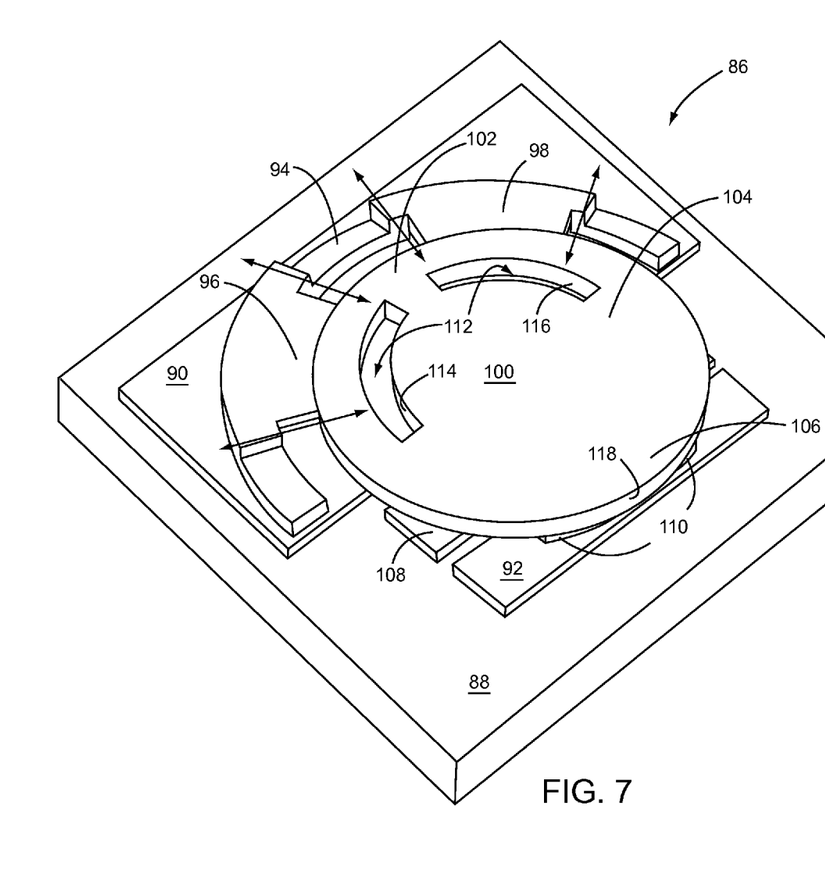
FIG. 7 depicts an adaptation of the DARPA proposed MEMS switch having anchors in accordance to the present disclosure.

FIG. 7 depicts an adaptation of the DARPA proposed MEMS switch 50 (FIG. 5) according to the present disclosure. The disclosed adaptation provides an anchor configuration that neutralizes cantilever disc deflection due to thermal expansion. As shown in FIG. 7, a micro-electromechanical system (MEMS) switch 86 includes a substrate 88 onto which a first conductive pad 90 and a second conductive pad 92 are formed. A conductive anchor 94 coupled to the first conductive pad 90. The conductive anchor 94 is a semi-circular frame that includes a first radial tab 96 and a second radial tab 98. The first radial tab 96 and the second radial tab 98 extend inwardly from the semi-circular frame. A conductive cantilever disc 100 has a first end portion 102, a middle portion 104, and a second end portion 106. The first end portion 102 of the conductive cantilever disc 100 is coupled to the first radial tab 96 and the second radial tab 98 of the conductive anchor 94. Radial tabs 96 and 98 are released from the substrate 88, are suspended above it, and are free to deform. A pair of strain relief slots 112 is defined by inner surfaces 114 and 116 within the first end portion 102 of the conductive cantilever disc 100. The pair of strain relief slots 112 provides mechanical strain relief as the conductive cantilever disc 100 expands during manufacturing or operation and were part of the original DARPA switch, as shown in FIG. 6. The second end portion 106 of the conductive cantilever disc 100 is suspended over the second conductive pad 92 with the middle portion 104 being between the first end portion 102 and the second end portion 106. A conductive actuator plate 108 is formed onto the substrate 88 at a location beneath the middle portion 104 of the conductive cantilever disc 100 and between the first conductive pad 90 and the second conductive pad 92. When an activation voltage is applied to the actuator plate 108, an electrostatic force pulls the conductive cantilever disc 100 towards the substrate 88 until one or more of a pair of electrical contacts 110 comes into contact with the second conductive pad 92.

Continuing with FIG. 7, attachment axes represented by the double arrowed line segments are perpendicular to a tangent around a circumference of the conductive cantilever disc 100. As a result, deflection of a tip 118 of the conductive cantilever disc 100 is significantly reduced. For example, a thermal finite element simulation of the MEMS switch 86 shows that a thermally induced deflection of the tip 118 is reduced by nearly a factor of four in comparison with the tip 82 of the cantilever disc 72 shown in FIG. 6. In fact, the tip deflection of the tip 118 of the conductive cantilever disc 100 deflects 0.08 μm away from the substrate 88 when the conductive cantilever disc 100 is at a temperature of 300° C.

Figure 8:
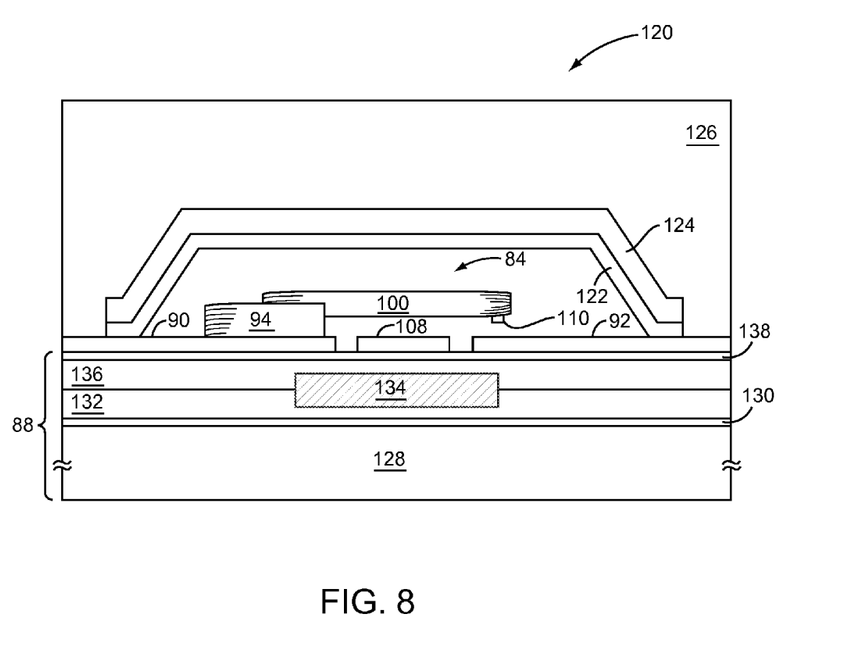
FIG. 8 depicts the MEMS switch of FIG. 7 integrated into a semiconductor device in accordance with the present disclosure.

Turning now to FIG. 8, a semiconductor device 120 that includes the MEMS switch 86 (FIG. 7) is disclosed. The MEMS switch 86 may be encapsulated by one or more encapsulating layers 122 and 124, which make up a wafer level package (WLP) around the MEMS switch 86. Moreover, the encapsulating layers 122 and 124 form a substantially hermetically sealed cavity about the conductive cantilever disc 100. The cavity is generally filled with an inert gas. Once the encapsulation layers 122 and 124 are in place, and any other semiconductor components are formed on the semiconductor substrate 88, a plastic overmold 126 may be provided over the encapsulation layers 122 and 124 and any other semiconductor components.

With continued reference to FIG. 8, the substrate 88 is preferably formed using a semiconductor-on-insulator process, such as a silicon-on-insulator process or silicon-on-sapphire process. In particular, the substrate 88 includes a handle wafer 128 that is formed from silicon, sapphire, glass, or like material to form a foundation layer for the semiconductor device 120. The handle wafer 128 is typically a few hundred microns thick. An insulator layer 130 is formed over the handle wafer 128. The insulator layer 130 is generally formed from an oxide, such as Silicon Dioxide ($SiO_2$), which may range in thickness from 0.1 to 2 microns in the preferred embodiment. A device layer 132, which may include one or more layers, is formed using an appropriate semiconductor material.

The device layer 132 is the layer or layers in which a plurality of active semiconductor devices 134, such as transistors and diodes that employ PN junctions, are formed. The plurality of active semiconductor devices may be formed using a complementary metal oxide semiconductor (CMOS) fabrication process. The device layer 132 is initially formed as a base semiconductor layer that is subsequently doped with N-type and P-type materials to form the active semiconductor devices. Thus, the active semiconductor devices, except for any necessary contacts or connections traces, are generally contained within the device layer 132. Those skilled in the art will recognize various techniques for forming active semiconductor devices in the device layer 132. A metal-dielectric stack 136 is formed over the device layer 132, wherein a plurality of metal and dielectric layers are alternated to facilitate connection with and between the active devices formed in the device layer 132. Further, in the preferred embodiment the handle wafer 128 is made of a high-resistivity semiconductor material where resistance is greater than 50 ohm-cm.

With the present disclosure, the plurality of active semiconductor devices 134 may be formed in the device layer 132 and connected to one another via the metal-dielectric stack 136 directly underneath the MEMS switch 86. Since the device layer 132 resides over the insulator layer 130, high voltage devices, which may exceed ten (10) volts in operation, may be formed directly under the MEMS switch 86 and connected in a way to control operation of the MEMS switch 86 or associated circuitry. Although silicon is described in the preferred embodiment, the semiconductor material for the device layer 132 may include gallium arsenide (GaAs), gallium nitride (GaN), indium phosphide (InP), silicon germanium (SiGe), sapphire, and like semiconductor materials. The device layer 132 typically ranges in thickness from 0.1 microns to 20 or more microns.

As illustrated in FIG. 8, a passivation layer 138 may be provided over the metal-dielectric stack 136. A metal layer used to form the first conductive pad 90, the second conductive pad 92, and the actuator plate 108 may be formed over the passivation layer 138 and etched to form the respective ones of the first conductive pad 90, the second conductive pad 92, and the actuator plate 108. Prior to packaging, the conductive cantilever disc 100 is 'released' and is free to actuate or deform. In particular, the conductive cantilever disc 100 may be released following formation of a small micro-cavity surrounding the MEMS switch 86. A sacrificial material such as polymethylglutarimide (PMGI) is etched away using wet etches. Following drying and cleaning of the MEMS switch 86, a dielectric is used to hermetically seal the micro-cavity. The deposition temperature for the dielectric is typically 250° C. Later in the manufacturing process, the device can experience multiple exposures to 260° C. solder reflow during attachment of a module incorporating the MEMS switch 86 to an end-user laminate.

Those skilled in the art will recognize improvements and modifications to the preferred embodiments of the present disclosure. All such improvements and modifications are considered within the scope of the concepts disclosed herein and the claims that follow.

What is claimed is:

1. A micro-electromechanical systems (MEMS) switch having a thermally tolerant anchor configuration comprising:
    a substrate;
    a conductive anchor coupled to the substrate, wherein the conductive anchor is a substantially semi-circular frame that includes a first radial tab and a second radial tab;
    a conductive cantilever disc having a first end portion, a middle portion, and a second end portion, wherein the first end portion is coupled to the first radial tab and the second radial tab of the conductive anchor such that the second end portion is suspended over the substrate; and
    a conductive actuator plate formed on the substrate at a location beneath the middle portion of the conductive cantilever disc.

2. The MEMS switch of claim 1 further including a pair of strain relief slots being defined by inner surfaces within the first end portion of the conductive cantilever disc.

3. The MEMS switch of claim 1 wherein a tip of the conductive cantilever disc deflects away from the substrate during thermal expansion of the conductive cantilever disc and the conductive anchor.

4. The MEMS switch of claim 3 wherein a tip deflection of the conductive disc is approximately 0.08 micrometers (μm) away from the substrate when a temperature of the MEMS switch is around 300° C.

5. A semiconductor device comprising:
    a substrate comprising a handle layer, an insulator layer over the handle layer, and a device layer over the handle layer in which a plurality of active semiconductor devices is formed; and
    a micro-electromechanical systems (MEMS) switch integrally formed on the substrate, the MEMS switch comprising:
        a conductive anchor coupled to the substrate, wherein the conductive anchor is a substantially semi-circular frame that includes a first radial tab and a second radial tab;
        a conductive cantilever disc having a first end portion, a middle portion, and a second end portion, wherein the first end portion is coupled to the first radial tab and the second radial tab of the conductive anchor such that the second end portion is suspended over the substrate; and
        a conductive actuator plate formed on the substrate at a location beneath the middle portion of the conductive cantilever disc; and
        further comprising an overmold covering the MEMS switch and the substrate, wherein an integrated module comprising the plurality of active semiconductor devices and the MEMS switch is formed.

6. The semiconductor device of claim 5 further including a pair of strain relief slots being defined by inner surfaces within the first end portion of the conductive cantilever disc.

7. The semiconductor device of claim 5 wherein a tip of the conductive cantilever disc deflects away from the substrate during thermal expansion of the conductive cantilever disc and the conductive anchor.

8. The semiconductor device of claim 7 wherein a tip deflection is approximately 0.08 micrometers (μm) away from the substrate when a temperature of the MEMS switch is around 300° C.

9. The semiconductor device of claim 5 further comprising:
   a multilayer encapsulation structure forming an enclosure about the conductive anchor, the conductive cantilever disc, and the conductive actuator plate; and
   an overmold covering the MEMS switch and the substrate, wherein an integrated module comprising the plurality of active semiconductor devices is formed.

10. The semiconductor device of claim 9 wherein a space encapsulated by the multilayer encapsulation structure is filled with an inert gas.

11. The semiconductor device of claim 5 wherein the device layer comprises silicon and the plurality of active semiconductor devices is formed using a complementary metal oxide semiconductor (CMOS) fabrication process.

12. The semiconductor device of claim 11 wherein the plurality of active semiconductor devices is transistors and diodes that employ PN junctions.

13. The semiconductor device of claim 5 wherein a passivation layer is provided over a metal-dielectric stack that is over the device layer.

* * * * *